United States Patent [19]

Kohga et al.

[11] 4,131,847

[45] Dec. 26, 1978

[54] DEVICE FOR MEASURING ACTIVE AND/OR REACTIVE COMPONENT OF AC CURRENT OR AC POWER

[75] Inventors: Masayuki Kohga, Tokyo; Katsuto Ishii, Tama, both of Japan

[73] Assignee: Shoei Electric Co., Ltd., Tokyo, Japan

[21] Appl. No.: 811,990

[22] Filed: Jun. 30, 1977

[30] Foreign Application Priority Data

Jul. 3, 1976 [JP] Japan .................................. 51-79287

[51] Int. Cl.² ............................................... G01R 7/00
[52] U.S. Cl. ...................................... 324/141; 324/142
[58] Field of Search .................................. 324/141, 142

[56] References Cited

U.S. PATENT DOCUMENTS

| T955,007 | 2/1977 | Milkovic | 324/141 |
| 4,055,803 | 10/1977 | Kraley et al. | 324/142 |

FOREIGN PATENT DOCUMENTS

907146  8/1972  Canada .................................. 324/141

*Primary Examiner*—Stanley T. Krawczewicz
*Attorney, Agent, or Firm*—Armstrong, Nikaido, Marmelstein & Kubovcik

[57] ABSTRACT

A device for measuring the active component and reactive component of AC current or AC power comprising a first detector detecting AC voltage of an AC circuit, a second detector detecting AC current flowing through the AC circuit, a phase shifter shifting the phase of the detected AC voltage by $\pi/2$, first switch selectively transmitting one of the detected AC voltage and the phase-shifted AC voltage, a signal generator generating a pulse signal lasting over a selected one half cycle of the two opposite half cycles constituting one cycle of the detected AC voltage transmitted through the first switch, a second switch responsive to the pulse signal to permit transmission of an AC voltage corresponding to the detected AC current, and a circuit computing the active or reactive component of the root mean square value of the AC current or power of the AC circuit on the basis of the AC voltage permitted to transmit through the second switch thereby providing an output signal representing the result of computation.

14 Claims, 9 Drawing Figures

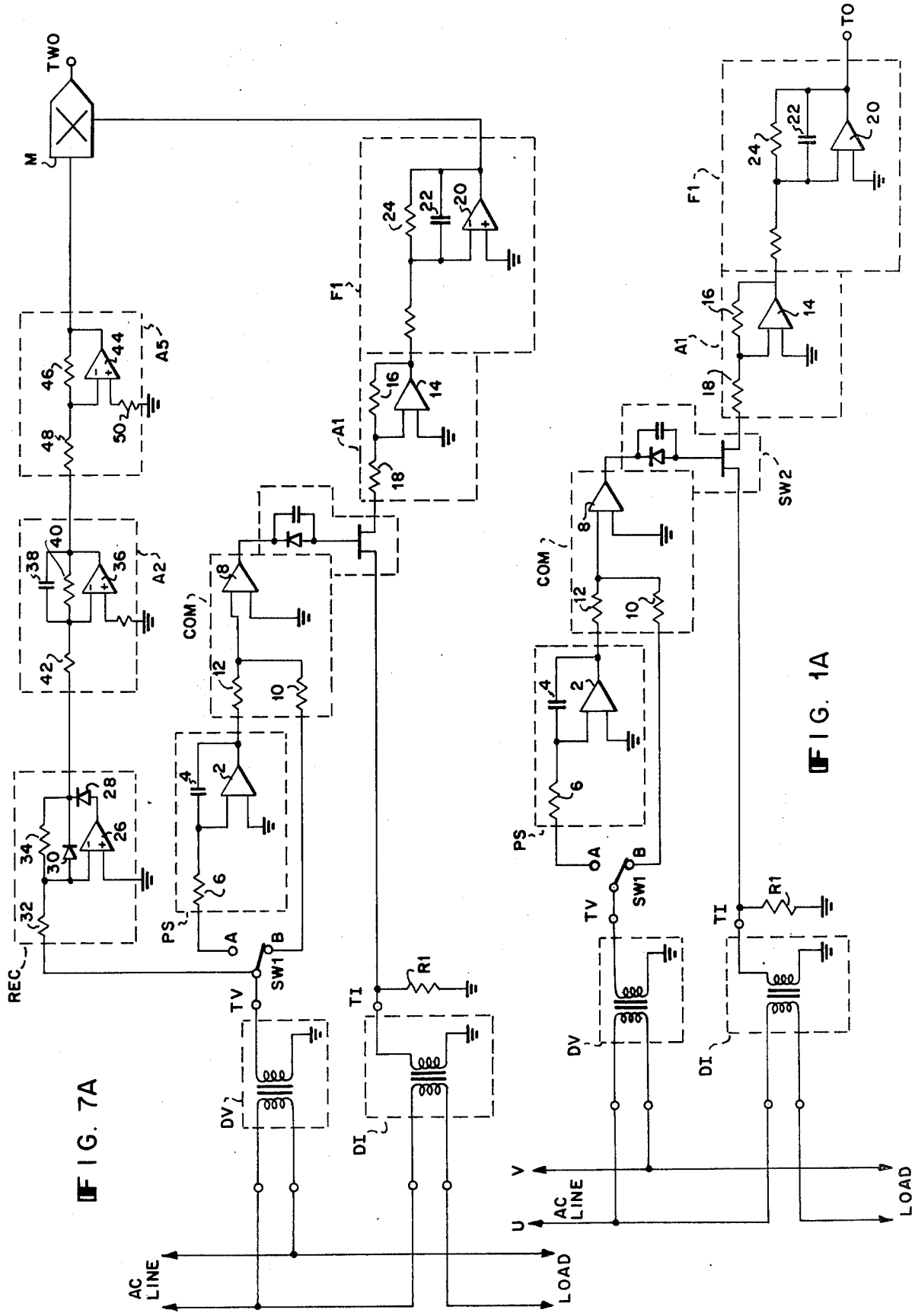

DEVICE FOR MEASURING ACTIVE AND/OR REACTIVE COMPONENT OF AC CURRENT OR AC POWER

BACKGROUND OF THE INVENTION

This invention relates to a device for measuring active and/or reactive component of current or power in an AC circuit.

It is commonly known that measurement of active power and reactive power in an AC power supply system is necessary for the rational control or management of the AC power supply system.

Measuring instruments of various types including the electrodynamometer type, inductive type and thermocouple type have heretofore been widely used for the measurement of active power, and for special purposes, electronic multipliers have been used to obtain the product of instantaneous values of AC voltage and current.

However, due to the fact that the prior art multiplier of the electromagnetic type such as the electrodynamometer type or inductive type is based on such a structural principle that its output is produced by torque, such output is not suitable for application as an input signal to an electronic control circuit or like circuit. Especially, the measuring instrument of the inductive type has such a defect that it is accompanied by a large error at a low power factor.

The measuring instrument of the thermocouple type can be used as a detector for control purposes as its output is the electromotive force produced by the thermocouple. However, this thermocouple type is also defective in that it can only provide a small electromotive force which necessitates additional provision of a large-gain amplifier.

The measuring instrument using the electronic multiplier for multiplying the instantaneous voltage and current values is suitble for control purposes. However, this electronic multiplier is generally quite expensive. An IC multiplier may be used for the purpose of multiplication of the above kind. However, this IC multiplier is generally based on such a structural principle as to utilize the ability of a semiconductor circuit to perform the exponential function and is therefore defective in that it lacks the stability of offset.

Measurement of reactive power has heretofore been attained by shifting the phase of an input to the active power measuring instrument by $\pi/2$ using an inductance element or capacitance element. In the case of measurement of reactive power in a balanced three-phase circuit, phase current in one phase and line-to-line voltage in the remaining two phases are applied into an ordinary wattmeter. Thus, application of this principle of measurement to an unbalanced circuit is difficult to be put into practice.

A measuring instrument using an electronic circuit for the computation of $$\sqrt{(\text{apparent power})^2 - (\text{active power})^2}$$

has also been proposed. However, this measuring instrument is defective in that not only addition of an expensive circuit to the active power measuring instrument is required, but also its output is not so precise.

SUMMARY OF THE INVENTION

It is a primary object of the present invention to provide a device for measuring active and/or reactive component of AC current or power, which is simple in circuit configuration, which can operate with a minimized measurement error, and the output of which can be utilized as a control signal.

In accordance with the present invention, there is provided a device for measuring the active component and reactive component of AC current or power, comprising means for detecting AC voltage of an AC circuit, means for detecting AC current flowing through the AC circuit, means for shifting the phase of the detected AC voltage by $\pi/2$, selective means for selectively transmitting one of the detected AC voltage and the phase-shifted AC voltage, means for generating a pulse signal lasting over a selected one half cycle of the two opposite half cycles constituting one cycle of the AC voltage transmitted through the selective means, means for producing thereacross an AC voltage corresponding to the level of the detected AC current, means responsive to the pulse signal to permit transmission therethrough of the AC voltage corresponding to the detected AC current, and means for computing the active or reactive component of the root mean square value of the current or power of the AC circuit on the basis of the AC voltage permitted to transmit through the pulse signal responsive means thereby providing an output signal representing the result of computation.

BRIEF DESCRIPTION OF THE DRAWINGS

FIG. 1A is a circuit diagram of the embodiment shown in FIG. 1.

FIG. 7A is a circuit diagram of the embodiment shown in FIG. 7.

DESCRIPTION OF THE PREFERRED EMBODIMENTS

Figure 1:
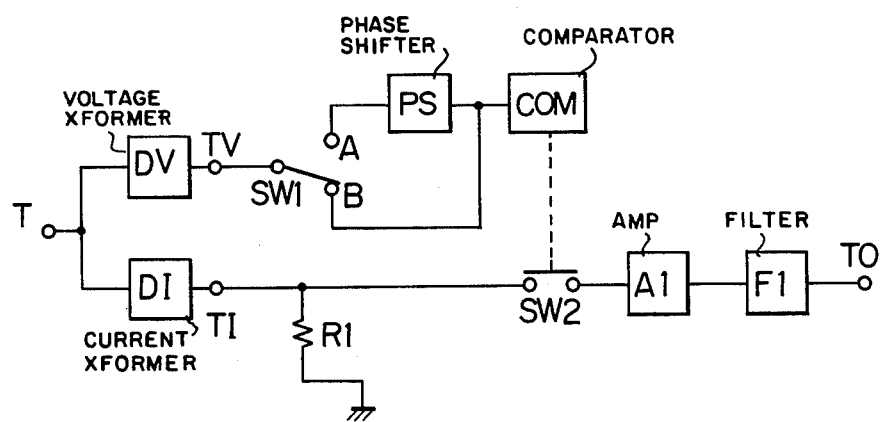
FIG. 1 is a block diagram of a first embodiment of the device according to the present invention.

In FIG. 1 showing a block diagram of a first embodiment of the measuring device according to the present invention, AC voltage of an AC circuit is applied through a terminal T to be detected by a detector such as a potential transformer DV. The detected AC voltage is applied through an input terminal TV and a changeover switch SW1 to a $\pi/2$ phase shifter PS when the switch SW1 is closed at its contact A and to a comparator COM when the switch SW1 is closed at its contact B. This comparator COM compares the AC input voltage with a reference voltage, which may be the zero value of the AC input voltage, and an output voltage appears from the comparator COM during only the positive or negative half cycle, for example, the positive half cycle of the AC input voltage. A detector such as a current transformer DI detects AC current flowing through the AC circuit, and the detected AC current is supplied through an input terminal TI to produce an AC voltage across a resistor R1. An electrode switch SW2 such as a transistor or FET is subject to on-off control by the output voltage of the comparator COM. This switch SW2 is connected to an amplifier A1 having a gain K1, and the amplifier A1 is connected to a filter F1 connected to an output terminal TO. This filter F1 may be a CR filter or an active filter employing an operational amplifier and provides an output representing the mean value of the input voltage.

Referring to FIG. 1A, phase shifter PS comprises an operational amplifier 2, capacitor 4 and resistor 6. This circuit is a conventional integrator circuit. Comparator COM is a conventional waveform convertor which comprises operational amplifier 8 and resistors 10 and 12. Amplifier A1 which is a conventional power amplifier, comprises an operational amplifier 14 and resistors 16 and 18. Filter F1 is a conventional active RC low pass filter. The filter comprises an operational amplifier 20, capacitor 22 and resistor 24.

In operation, the change-over switch SW1 is initially closed at its contact B, and the detected AC circuit voltage is applied to the input terminal TV. The AC current of the AC circuit is detected by the current transformer DI, and the detected current is supplied to the resistor R1. The detected AC voltage V1 (FIG. 2) applied to the input terminal TV is applied to the comparator COM through the contact B of the change-over switch SW1. The comparator COM delivers an output voltage V2 in each positive half cycle of the AC input voltage V1, as shown in FIG. 2, to turn on the electronic switch SW2.

Figure 2:
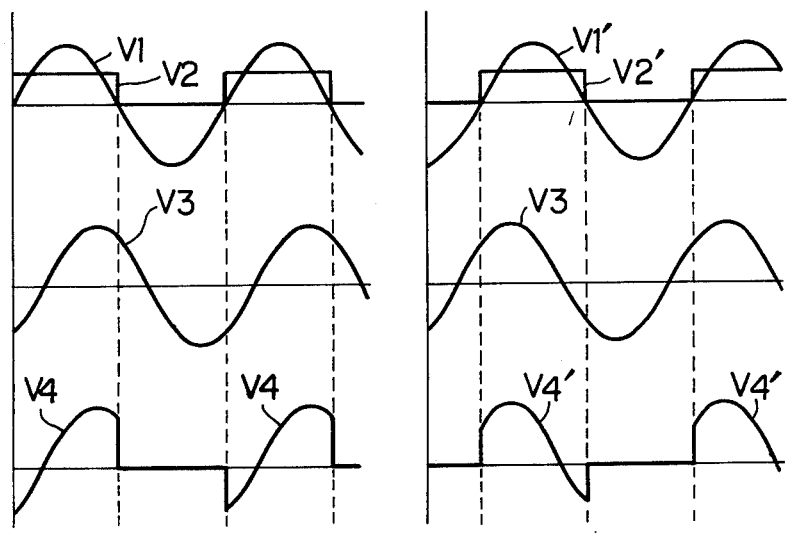
FIG. 2 shows waveforms appearing at various parts of FIG. 1.

An AC voltage V3 of the same phase as the input AC current appears across the resistor R1, as shown in FIG. 2, to be applied to the amplifier A1 through the electronic switch SW2. An output voltage V4 having a waveform as shown in FIG. 2 appears from the amplifier A1 since the electronic switch SW2 is turned on in each positive half cycle of the AC voltage input to the comparator COM, that is, the detected AC voltage applied to the input terminal TV. Therefore, when this output voltage V4 of the amplifier A1 is applied to the filter F1, the output voltage V5 of the filter F1 applied to the output terminal TO represents the mean value of the voltage V4, that is, the active component of the AC current of the AC circuit.

Suppose that i, I, $\phi$ and Ia are the instantaneous value of the detected AC circuit current supplied to the input terminal TI, the root mean square value of the AC circuit current, the phase angle of the input current relative to the input voltage, and the active component of the input current, respectively. Then, the following equations hold:

$$i = \sqrt{2} I \sin(\omega t + \phi) \quad (1)$$

$$Ia = \omega \frac{I}{2} \int_0^{\frac{\pi}{\omega}} \sin(\omega t + \phi) dt \quad (2)$$

In the case in which the electtonic switch SW2 is turned on in each negative half cycle of the AC circuit voltage, Ia is expressed as $$Ia = -\omega \frac{I}{2} \int_{\frac{\pi}{\omega}}^{\frac{2\pi}{\omega}} \sin(\omega t + \phi) dt \quad (3)$$

Therefore, the output voltage V5 appearing at the output terminal TO is given by $$V5 = \frac{\sqrt{2} K1 \cdot R1}{\pi} \cdot Ia \quad (4)$$

Then, when the change-over switch SW1 is closed at the contact A, the detected AC circuit voltage V1 applied to the input terminal TV is now applied through the contact A of the switch SW1 to the phase shifter PS to be shifted in its phase by $\pi/2$. As a result, the input voltage and output voltage of the comparator COM are now V1' and V2' instead of V1 and V2 respectively as shown in FIG. 2. Since the phase of the voltage V3 appearing across the resistor R1 remains the same, the output voltage of the amplifier A1 is now V4' instead of V4 as shown in FIG. 2, and an output voltage V5' representing the reactive component Ir of the AC circuit current appears at the output terminal TO. That is, this reactive component Ir is given by $$Ir = \omega \frac{I}{2} \int_{\frac{\pi}{2\omega}}^{\frac{3\pi}{2\omega}} \sin(\omega t + \phi) dt \quad (5)$$

or $$Ir = -\omega \frac{I}{2} \int_{\frac{3\pi}{2\omega}}^{\frac{5\pi}{2\omega}} \sin(\omega t + \phi) dt \quad (6)$$

and, the output voltage V5' is given by $$V5' = \frac{\sqrt{2} K1 \cdot R1}{\pi} \cdot Ir \quad (7)$$

Figure 3:
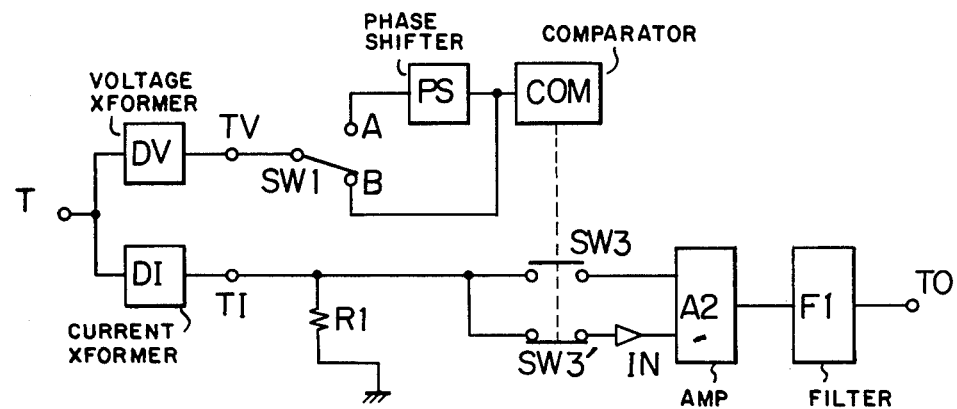
FIG. 3 is a block diagram of a second embodiment of the present invention.

FIG. 3 is a block diagram of a second embodiment of the present invention. In FIG. 3, the reference characters SW3 and SW3' designate a normally-open electronic switch and a normally-closed electronic switch respectively which are arranged for interlocking operation. The characters IN and A2 designate an inverter and a summing amplifier respectively. In FIG. 3, like reference characters are used to denote like parts appearing in FIG. 1.

Figure 4:
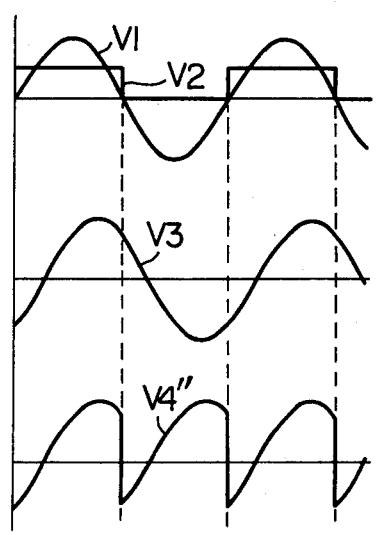
FIG. 4 shows waveforms appearing at various parts of FIG. 3.

In operation, a change-over switch SW1 is closed at its contact B to apply the detected AC circuit voltage to a comparator COM through an input terminal TV and the contact B of the switch SW1, and the detected AC circuit current is supplied to a resistor R1 through an input terminal TI. FIG. 4 shows the relation among the input AC voltage V1 and output voltage V2 of the comparator COM and the voltage V3 appearing across the resistor R1. It will be seen that this relation is entirely similar to that shown in FIG. 2.

In response to the application of the output voltage of the comparator COM to the electronic switches SW3 and SW3' arranged for interlocking operation, the switches SW3 and SW3' are closed and opened respectively, and the voltage V3 appearing across the resistor R1 is applied through the switch SW3 to one of the summing input terminals of the summing amplifier A2. The switches SW3 and SW3' are opened and closed respectively as soon as the output of the comparator COM disappears. The voltage V3 appearing across the resistor R1 is now applied through the switch SW3' to the inverter IN to be inverted in polarity, and the output of the inverter IN is applied to the other summing input terminal of the summing amplifier A2.

Therefore, the output voltage V4" of the summing amplifier A2, hence, the input to a filter F1 has a frequency two times as high as that of V4' in FIG. 2, and the filter F1 can be miniaturized correspondingly.

In the first embodiment shown in FIG. 1, the output voltage appearing at the output terminal TO has a level corresponding to that given by the equation (2) or (3), that is, a level corresponding to the integration of one half cycle only of the AC waveform. In the case of this second embodiment, the output voltage appearing at the output terminal TO has a level corresponding to the value obtained by inverting the sign of the equation (3) and adding it to the equation (2), that is, a level corresponding to the integration of one complete cycle of the AC waveform. Therefore, the output voltage of the second embodiment is two times as large as that of the first embodiment, and the sensitivity and precision of measurement of the active current can be improved.

The same applies to the measurement of the reactive component of AC current in which case the change-over switch SW1 is closed at its contact A.

Figure 5:
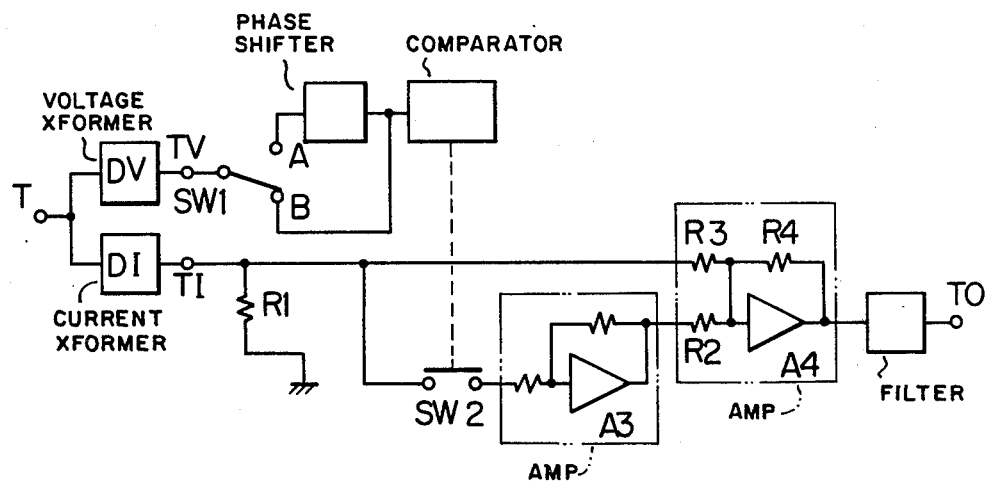
FIG. 5 is a block diagram of a third embodiment of the present invention.

FIG. 5 is a block diagram of a third embodiment of the present invention. In FIG. 5, the reference character A3 designates an inverting amplifier which may be an operational amplifier. The character A4 designates a summing amplifier which may also be an operational amplifier. Input resistors R2, R3 and a feedback resistor R4 for the amplifier A4 have the relations 2R2 = R3 and K2·R2 = R4. In FIG. 5, like reference characters are used to denote like parts appearing in FIG. 1.

Figure 6:
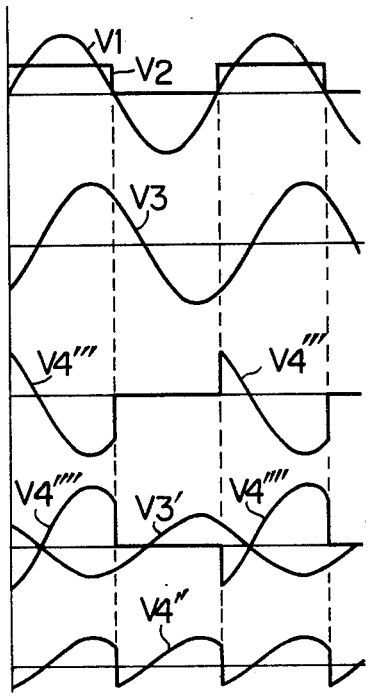
FIG. 6 shows waveforms appearing at various parts of FIG. 5.

In operation, a change-over switch SW1 is closed at its contact B to apply the detected AC circuit voltage to a comparator COM through an input terminal TV and the contact B of the switch SW1, and the detected AC circuit current is supplied to a resistor R1 through an input terminal T1. FIG. 6 shows the relation among the input AC voltage V1 and output voltage V2 of the comparator COM and the voltage V3 appearing across the resistor R1.

In this third embodiment, the voltage V3 appearing across the resistor R1 is applied to the inverting amplifier A3 through an electronic switch SW2 which is cyclically turned on and off. When the gain of this inverting amplifier A3 is selected to be unity, the output voltage V4''' of the amplifier A3 has the same amplitude as the voltage V3 but is inverted in polarity as shown in FIG. 6. Such a voltage V4''' is applied to the summing amplifier A4 through the input resistor R2.

The voltage V3 appearing across the resistor R1 is also applied through the input resistor R3 to the summing amplifier A4 without being passed through the amplifier A3. Since the resistance value of the input resistor R3 is selected to be two times as large as that of the input resistor R2, the summing amplifier A4 provides an output voltage V3' corresponding to the input voltage V3 and an output voltage V4'''' corresponding to the input voltage V4''' as shown in FIG. 6. The amplitude of the voltage V4'''' is two times as large as that of the voltage V3' as seen in FIG. 6. Therefore, the composite output voltage V4" of the summing amplifier A4 has a frequency two times as high as that of the equivalent shown in FIG. 2, as in the case of FIG. 4. Thus, the filter F1 can be miniaturized correspondingly, and the sensitivity and precision of measurement of the active current can be improved.

The same applies to the measurement of the reactive component of AC current in which case the change-over switch SW1 is closed at its contact A.

When the AC circuit voltage is constant, the active power and reactive power can be measured by multiplying by a suitable constant the active current value and reactive current value obtained in the manner above described. In the case of the third embodiment shown in FIG. 5, for example, the resistance value of the feedback resistor R4 for the amplifier A4 may be suitably selected so that the active power and reactive power may be readily measured from the output voltage appearing at the output terminal TO.

Figure 7:
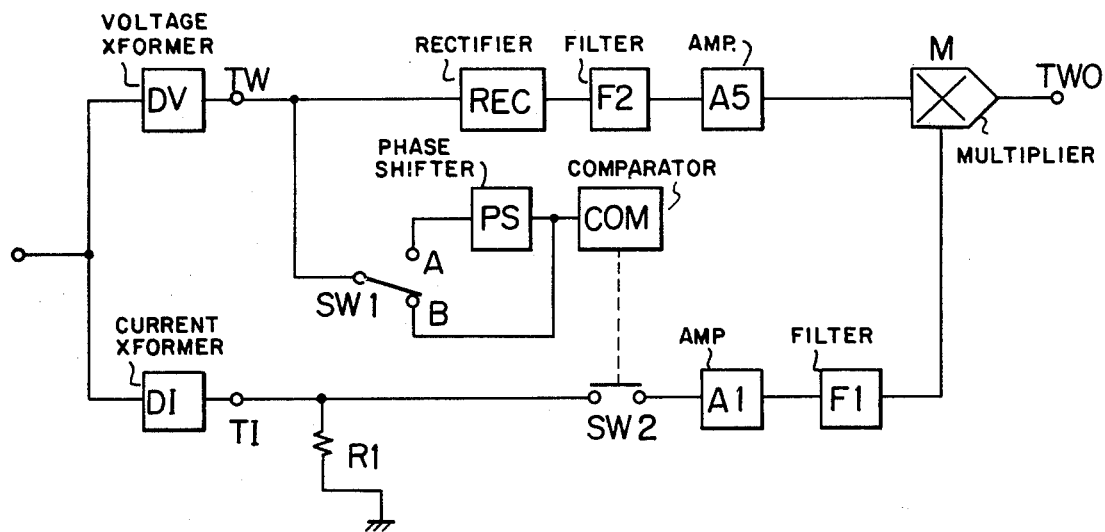
FIGS. 7, 8 and 9 are block diagrams of a fourth, a fifth and a sixth embodiment of the present invention.

FIG. 7 is a block diagram of a fourth embodiment of the present invention which is preferably used to measure the active power and reactive power when the AC circuit voltage is not constant. In FIG. 7, the reference characters REC, F2, A5, M and TWO designate a full-wave or half-wave rectifier circuit, a filter, an amplifier, a multiplying circuit and an output terminal, respectively. In FIG. 5, like reference characters are used to denote like parts appearing in FIG. 1.

Referring to FIG. 7A, elements which are the same as those described with respect to FIG. 1A have been given like designations in FIG. 7A. Rectifier REC is a conventional rectifier circuit having conventional semiconductors and an operational amplifier. Specifically, the circuit includes operational amplifier 26, diodes 28 and 30 and resistors 32 and 34. The output of rectifier REC is coupled to filter F2 which comprises operational amplifier 36, capacitor 38 and resistors 40 and 42. The output of filter F2 is applied to a conventional power amplifier A5 which includes operational amplifier 44 and resistors 46, 48 and 50.

In operation, the detected AC circuit voltage is applied to an input terminal TV, and the detected AC current is supplied through an input terminal TI to a resistor R1. A change-over switch SW1 is changed over between its contacts B and A so that output voltages V5 and V5' appear from a filter F1 depending on the position of the switch SW1, as described with reference to FIG. 1. The output voltages V5 and V5' are similarly given by $$V5 = \frac{\sqrt{2} \, K1 \cdot R1}{\pi} \cdot Ia$$

$$V5' = \frac{\sqrt{2} \, K1 \cdot R1}{\pi} \cdot Ir$$

and thus correspond to the active component and reactive component of the AC current respectively.

The detected AC circuit voltage V1 applied to the input terminal TV is rectified by the rectifier circuit REC and is then applied to the amplifier A5 through the filter F2. Suppose that E1 is the root mean square value of the voltage V1, K3 is the gain of the amplifier A5, and the rectifier circuit REC is of the half-wave rectifying type. Then, the output voltage V6 of the amplifier A5 is given by $$V6 = \frac{\sqrt{2} \, K3 \cdot E1}{\pi}$$

The output voltage V6 of the amplifier A5 and the output voltage V5 or V5' of the filter F1 are applied to the multiplying circuit M to be multiplied by each other. The output voltage V7 or V7' delivered from the multiplying circuit M to appear at the output terminal TWO is given by $$V7 = \frac{2K1 \cdot K3 \cdot R1}{\pi^2} \cdot Ia \cdot E1 \qquad (8)$$

$$V7' = \frac{2K1 \cdot K3 \cdot R1}{\pi^2} \cdot Ir \cdot E1 \qquad (9)$$

Thus, by suitably selecting the value of K3, the active power and reactive power can be sought from the output voltages V7 and V7' respectively. It is to be understood that, when the rectifier circuit REC is of the full-wave rectifying type, the output voltage V6 of the amplifier A5 is two times as great as that above described, and the sensitivity of measurement can be improved correspondingly. The switch SW2 and amplifier A1 employed in this fourth embodiment may be replaced by the switches SW3, SW3', inverter IN and amplifier A2 used in the second embodiment. Further, the amplifier A1 may be replaced by the amplifiers A3 and A4 employed in the third embodiment.

Figure 8:
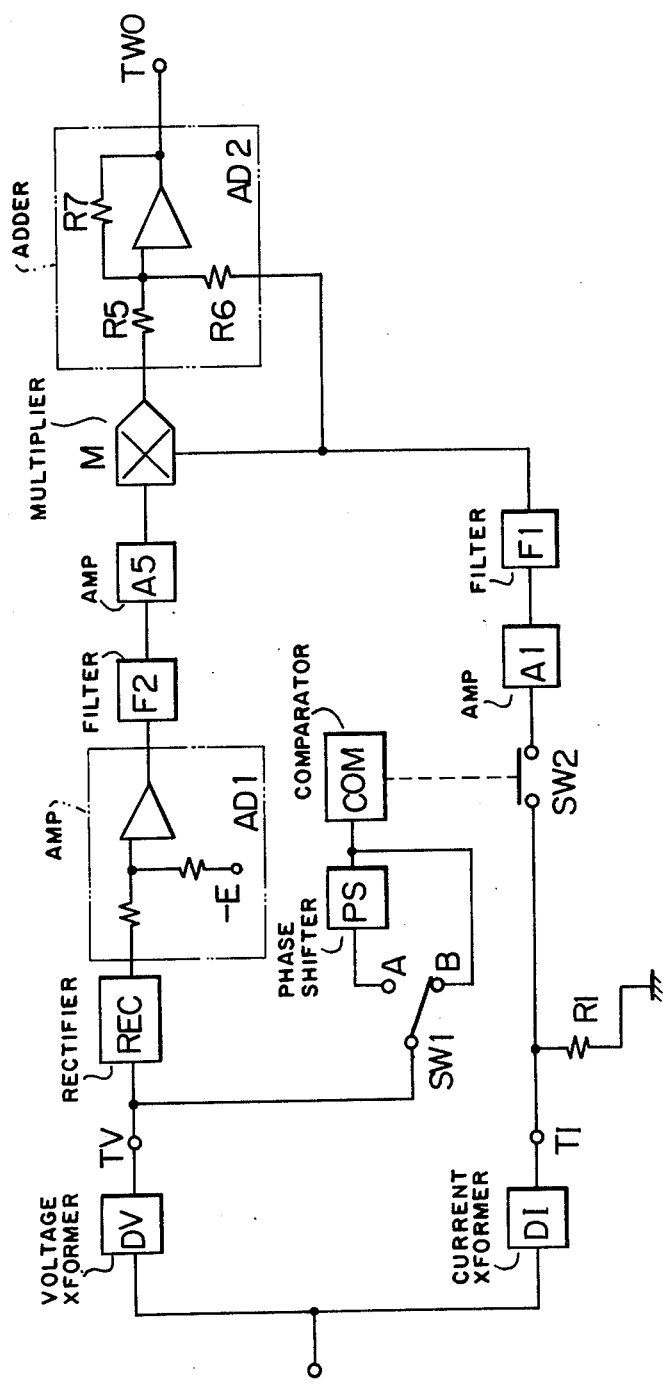

FIG. 8 is a block diagram of a fifth embodiment of the present invention which is preferably used for the measurement of the active power and reactive power when the AC circuit voltage includes a steady component and a varying component. In FIG. 8, the reference characters AD1 and AD2 designate adder circuits which may both be operational amplifiers. Input resistors R5, R6 and a feedback resistor R7 for the adder circuit AD2 have the relations R5 = K4·R7 and R6 = K5·R7. In FIG. 8, like reference characters are used to denote like parts appearing in FIG. 7.

In operation, the detected AC circuit voltage V1 is applied through an input terminal TV to a rectifier circuit REC, and the rectified voltage is applied from the rectifier circuit REC to the adder circuit AD1. In the adder circuit AD1, the DC voltage E corresponding to the steady component of the AC circuit voltage is subtracted from the voltage E1' corresponding to the root mean square value E1 of the AC circuit voltage V1, and the resultant output ΔE is applied to a filter F2.

The output voltage ΔE of the adder circuit AD1 is given by $$\Delta E = E1' - E$$

It will be seen that this output voltage ΔE represents the deviation of the voltage E1' from the DC voltage E, and such output ΔE is applied through the filter F2 to an amplifier A5. Therefore, the voltage V6 applied from the amplifer A5 to the multiplying circuit M is given by $$V6 = \frac{\sqrt{2} \, K3 \cdot \Delta E}{\pi}$$

and this voltage V6 is multiplied by the output voltage V5 or V5' of a filter F1 in the multiplying circuit M. The output voltage V7 or V7' of the multiplying circuit M is given by $$V7 = V5 \times V6$$

$$= \frac{\sqrt{2} \, K1 \cdot R1}{\pi} \times \frac{\sqrt{2} \, K3 \cdot \Delta E}{\pi} \cdot Ia$$

$$= \frac{2K1 \cdot R1 \cdot K3 \cdot \Delta E}{\pi^2} \cdot Ia$$

$$V7' = V5' \times V6$$

$$= \frac{2K1 \cdot R1 \cdot K3 \cdot \Delta E}{\pi^2} \cdot Ir$$

This output voltage V7 or V7' is applied through the input resistor R5 to the adder circuit AD2 to be added to the output voltage V5 or V5' of the filter F1 applied through the input resistor R6. As a result, the adder circuit AD2 delivers an output voltage V8 or V8' given by $$V8 = \frac{V7}{K4} + \frac{V5}{K5}$$

$$= \frac{2K1 \cdot R1 \cdot K3 \cdot \Delta E \cdot Ia}{K4 \cdot \pi^2} + \frac{\sqrt{2} \, K1 \cdot R1 \cdot Ia}{K5 \cdot \pi}$$

$$= \frac{2K1 \cdot R1}{\pi^2} \left( \frac{K3}{K4} \Delta E \cdot Ia + \frac{\pi}{K5 \sqrt{2}} Ia \right)$$

$$V8' = \frac{V7'}{K4} + \frac{V5'}{K5}$$

$$= \frac{2K1 \cdot R1 \cdot K3 \cdot \Delta E \cdot Ir}{K4 \cdot \pi^2} + \frac{\sqrt{2} \, K1 \cdot R1 \cdot Ir}{K5 \cdot \pi}$$

$$= \frac{2K1 \cdot R1}{\pi^2} \left( \frac{K3}{K4} \Delta E \cdot Ir + \frac{\pi}{K5 \sqrt{2}} Ir \right)$$

When K3 and K5 are selected to be K3 = K4 and $$K5 = \frac{\pi}{E \sqrt{2}},$$

$$V8 = \frac{2K1 \cdot R1}{\pi^2} \cdot E1 \cdot Ia \qquad (10)$$

$$V8' = \frac{2K1 \cdot R1}{\pi^2} \cdot E1 \cdot Ir \qquad (11)$$

sine ΔE = E1' − E

Thus, the active power and reactive power can be sought from the output voltages V8 and V8' respectively.

In this fifth embodiment, the voltage corresponding to the varying component of the AC circuit voltage is multiplied in the multiplying circuit M by the voltage corresponding to the active or reactive component of the AC current. It is therefore possible to improve the precision of the output of the multiplying circuit M compared with the multiplication on the full input voltage.

Although the filter F2 is disposed on the output side of the adder circuit AD1, it may be disposed on the input side of the adder circuit AD1. Further, the switch SW2 and amplifier A1 in this fifth embodiment may be replaced by the switches SW3 and SW3', inverter IN and amplifier A2 employed in the second embodiment. Furthermore, the amplifier A1 in this fifth embodiment may be replaced by the amplifiers A3 and A4 employed in the third embodiment.

Figure 9:
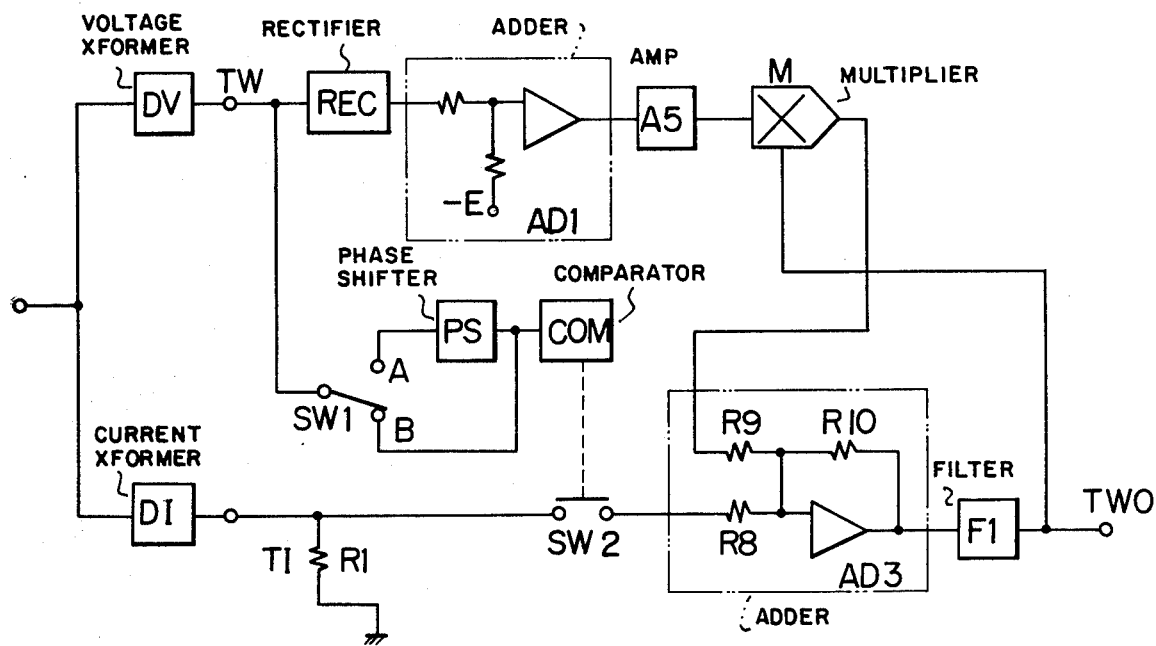

FIG. 9 is a block diagram of a sixth embodiment of the present invention which is preferably used for the measurement of the active power and reactive power when the AC circuit voltage varied only slightly. In FIG. 9, the reference character AD3 designates an adder circuit having input resistors R8, R9 and a feedback resistor R10. These resistors have the relations R9 = K6 · R8 and R10 = K7 · R8. In FIG. 9, like reference characters are used to denote like parts appearing in FIG. 8.

In this sixth embodiment too, the detected AC circuit voltage V1 is applied through an input terminal TV to a rectifier circuit REC to be rectified, and the rectified voltage is applied to an adder circuit AD1. In the adder circuit AD1, the DC voltage E corresponding to the steady component of the AC circuit voltage V1 is subtracted from the voltage E1' corresponding to the root mean square value E1 of the AC circuit voltage V1, and the resultant output is applied to an amplifier A5. Thus, the output voltage V6 of the amplifier A5 is $$V6 = \frac{\sqrt{2} \, K3 \cdot \Delta E}{\pi}$$

as in the fifth embodiment.

In this sixth embodiment, it is supposed that the AC circuit voltage varies very slightly. In operation, the voltage V3 appearing across a resistor R1 is applied through a switch SW2 and the input resistor R8 to the adder circuit AD3. The output of this adder circuit AD3 is applied to an output terminal TWO through a filter F1. Further, the resistance value of the feedback resistor R10 for the adder circuit AD3 may be suitably selected as described with reference to FIG. 5. In this manner, the output voltage appearing at the output terminal TWO may be regarded to substantially accurately correspond to the active power or reactive power. In FIG. 9, this output voltage is applied to a multiplying circuit M to be multiplied by the output voltage V6 of the amplifier A5, and the resultant voltage is fed back to the adder circuit AD3 so as to perform precise measurement by correcting any error included in the output voltage appearing at the output terminal TWO due to a slight variation in the AC circuit voltage.

Suppose that V3', V9, and V10 are the input voltage of the adder circuit AD3, the output voltage of the multiplying circuit M, and the output voltage of the adder circuit AD3 passed through the filter F1, respectively. Then, the following relation holds:

$$-\frac{V10}{R} = \frac{V3'}{R8} - \frac{V6 \cdot V10}{R9}$$

Since R9 and R10 are selected to be R9 = K6 · R8 and R10 = K7 · R8 as described above, V10 is given by $$V10 = -\frac{V3'}{\frac{1}{K7} - \frac{V6}{K6}} = -\frac{K7 \cdot V3'}{1 - \frac{K7}{K6} \cdot V6}$$

Further, due to the fact that $$V3' = \frac{\sqrt{2} \, R1 \cdot Ia}{\pi},$$

V10 is expressed as $$V10 = -\frac{K7 \times \frac{\sqrt{2} \, R1 \cdot Ia}{\pi}}{1 - \frac{K7}{K6} \times \frac{2 \, K3 \cdot \Delta E}{\pi}}$$

When K3, K6 and K7 are selected to satisfy the relations $$K7 = \frac{\sqrt{2} \, K1}{\pi} \cdot E$$

$$\frac{K3}{K6} = \frac{\pi^2}{2E^2 K1},$$

V10 is expressed as $$V10 = -\frac{2K1 \cdot R1 \cdot Ia}{\pi^2} \times \frac{1}{1 - \frac{\Delta E}{E}} \times E$$

Since $\Delta E/E \ll 1$, V10 may be expressed as $$V10 \approx -\frac{2K1 \cdot R1 \cdot Ia}{\pi^2} \cdot (1 + \frac{\Delta E}{E}) E \qquad (12)$$

$$= -\frac{2K1 \cdot R1 \cdot Ia}{\pi^2} \cdot (E + \Delta E)$$

$$= -\frac{2K1 \cdot R1 \cdot Ia}{\pi^2} \cdot E1'$$

Thus, the active power can be sought from the output voltage V10 when the AC circuit voltage varies very slightly.

When the switch SW1 is closed at its contact A from the position shown in FIG. 9, V3' is now given by $$V3' = \frac{\sqrt{2} \, R1 \cdot Ir}{\pi}$$

and the reactive power can be sought from the output voltage V10' appearing at the output terminal TWO.

This sixth embodiment is also effective in improving the precision of the output appearing from the multiplying circuit M due to the fact that the voltage corresponding to the varying component of the AC circuit voltage is multiplied by the voltage corresponding to the active or reactive component of the AC current instead of multiplication on the full AC circuit voltage.

The operation of the added circuit AD3 in this sixth embodiment is similar to that of the amplifier A1 and adder circuit AD2 in the fifth embodiment shown in FIG. 8, and the filter F1 in this sixth embodiment has both the functions of the filters F1 and F2 in the fifth embodiment shown in FIG. 8. The circuit configuration of this sixth embodiment is therefore simpler than that of the fifth embodiment. The switch SW2 in this sixth embodiment may be replaced by the switches SW3, SW3', inverter IN and amplifier A2 employed in the second embodiment. Further, the switch SW2 in this sixth embodiment may be replaced by the switch SW2 and amplifiers A3 and A4 employed in the third embodiment.

It is apparent that the inverter IN shown in FIG. 3 may be connected to the normally-open switch SW3 in lieu of being connected to the normally-closed switch SW3' when the device shown in FIG. 3 is used for the measurement of the active component and reactive component of AC current or AC power.

In the afoementioned embodiments of the present invention, the switch SW1 and $\pi/2$ phase shifter PS are disposed in the preceding stage of the comparator COM for shifting the phase of the detected AC voltage by $\pi/2$ by changing over the switch SW1 so that the active component and reactive component of AC current or power can both be measured. However, the switch SW1 and $\pi/2$ phase shifter may be eliminated, and the detected AC circuit voltage may be directly applied to the comparator COM so as to measure the active component only of AC current or power. Further, the switch SW1 may be eliminated, and the detected AC circuit voltage may be applied to the comparator COM after shifting the phase by $\pi/2$ by the $\pi/2$ phase shifter so as to measure the reactive component only of AC current or power.

It will be understood from the foregoing detailed description that the device according to the present invention is quite simple in circuit configuration and can be semiconductorized to be readily put into a module form or integrated circuit form. The device of the present invention provides an output in electrical signal form which can be measured at a remote point and can be used intact as a control signal. In the measurement of active power and reactive power, signals in DC form are multiplied in a multiplier instead of multiplying instantaneous AC voltage and current values. Thus, even in the case of measurement of power including a slight active or reactive component in spite of a large amplitude, a large gain can be provided with satisfactory precision especially for the current value, and the precision of the output can be easily improved.

The device of the present invention is arranged for multiplying the voltage and current in DC form as described. Therefore, the multiplying circuit may be of the low speed type. Further, due to the fact that the varying component only of AC circuit voltage is corrected when the AC circuit voltage varies very slightly, the desired precision in the output can be ensured without using an expensive multiplying circuit designed for operation with high precision.

We claim:

1. A device for measuring active and/or reactive component of AC current comprising:
   first means for detecting an AC voltage of an AC circuit;
   second means for detecting an AC current flowing through the AC circuit;
   third means for generating a pulse signal lasting over a selected one-half cycle of the two opposite half cycles constituting one AC cycle of the AC output voltage of said first means;
   fourth means connected to said second and third means for controlling transmission of the output AC signal of said second means in response to said pulse signal; and
   fifth means connected to said fourth means for delivering the signal corresponding to the signal controlled by said fourth means as an output signal.

2. A measuring device as claimed in claim 1, wherein said first means includes a circuit for shifting the phase of the detected AC voltage.

3. A measuring device as claimed in claim 1, wherein said second means includes a circuit for shifting the phase of the detected AC current.

4. A measuring device as claimed in claim 2, wherein the phase of the detected AC voltage is shifted by $\pi/2$.

5. A measuring device as claimed in claim 3, wherein the phase of the detected AC current is shifted by $\pi/2$.

6. A measuring device as claimed in claim 1, wherein the fourth means includes a one mode operating switch which is actuated either to be closed or to be opened in response to said pulse signal to permit or inhibit transmission of the output AC signal of said third means therethrough during its closed or opened period.

7. A measuring device as claimed in claim 6, wherein said fifth means includes a circuit for producing a signal corresponding to the difference between a signal representing the output of said second means and a signal representing two times as large as the output of said fourth means and for delivering the amplified difference as the output signal representing the result of measuring.

8. A device for measuring active and/or reactive component of AC power comprising:
   first means for detecting an AC voltage of an AC circuit;
   second means for detecting an AC current flowing through the AC circuit;
   third means for generating a pulse signal lasting over a selected one-half cycle of the two opposite half cycles constituting one AC cycle of the AC output voltage of said first means;
   fourth means connected to said second and third means for controlling transmission of the output AC signal of said second means in response to said pulse signal;
   fifth means connected to said fourth means for producing a signal corresponding to the signal controlled by said fourth means;
   sixth means for converting the AC voltage detected by said first means into a signal representing the linear transform of said detected AC voltage;
   seventh means for multiplying the output signal of said fifth means by the output signal of said sixth means; and
   eighth means connected to said seventh means for delivering a signal corresponding to the output signal of said seventh means as an output signal representing the result of measuring.

9. A measuring device as claimed in claim 8, wherein said sixth means includes a circuit for subtracting a constant valve from said converted signal and applying an output signal representing the result of the subtraction to said seventh means, and said eight means includes a circuit for adding the output signal of said seventh means to the output signal of said fifth means.

10. A measuring device as claimed in claim 8, wherein said sixth means includes a circuit for subtracting a constant valve from said converted signal and applying an output signal representing the result of subtraction to one of input terminals of said seventh means, and said fifth means includes a circuit for adding the output signal of said fourth means to the output signal of said seventh means and feeding back the output signal to another of input terminals of said seventh means.

11. A measuring device as claimed in claim 8, wherein said first means includes a circuit for shifting the phase of the detected AC voltage.

12. A measuring device as claimed in claim 8, wherein said second means includes a circuit for shifting the phase of the detected AC current.

13. A measuring device as claimed in claim 11, wherein the phase of the detected AC voltage is shifted by $\pi/2$.

14. A measuring device as claimed in claim 12, wherein the phase of the detected AC current is shifted by $\pi/2$.

* * * * *